United States Patent [19]
Basse et al.
[11] 3,895,311
[45] July 15, 1975

[54] DIRECT PROGRAMMED DIFFERENTIAL SYNTHESIZERS

[75] Inventors: Philip Basse; Ronald J. Juels, both of Freeport, N.Y.
[73] Assignee: Comstron Corporation, Richmond Hill, N.Y.

[22] Filed: June 14, 1974
[21] Appl. No.: 479,311

[52] U.S. Cl. ........................ 331/1 A; 331/2; 331/25
[51] Int. Cl.² ............................................ H03B 3/04
[58] Field of Search .................... 331/1 A, 2, 18, 25

[56] References Cited
UNITED STATES PATENTS
3,344,361 9/1967 Granquist ............................ 331/18
3,588,730 6/1971 Schreuer et al......................... 331/2

*Primary Examiner*—Siegfried H. Grimm
*Attorney, Agent, or Firm*—Arthur L. Plevy

[57] ABSTRACT

A frequency synthesizer employs a main phase locked loop and a vernier phase locked loop, each including a voltage controlled oscillator (VCO) a programmable divider and a phase detector, the main loop is operative in a first and second mode to divide said VCO frequency via said programmable divider by a factor determined by a plurality of switch settings. The first mode causing a division factor according to the most significant switch setting and the second mode causing a division factor according to least significant switch settings, said main VCO caused to provide a frequency at an output equal to a reference frequency multiplied by the sum of said first and second integers. The vernier loop divider is programmed by others of said switches to cause its VCO to provide a frequency, which when subtracted from said main VCO frequency, equals the numerical setting selected by said switches.

10 Claims, 2 Drawing Figures

DIRECT PROGRAMMED DIFFERENTIAL SYNTHESIZERS

BACKGROUND OF INVENTION

This invention relates to frequency synthesizers and more particularly to such a synthesizer which is capable of being programmed or set at a desired frequency by means of programmed input controls.

The frequency synthesizer is a well known and widely used test instrument. Basically, frequency synthesis involves two distinct approaches, sometimes referred to as direct synthesis and indirect synthesis. All such synthesizers utilize a source of reference frequency, such as a quartz oscillator, or atomic standard or some other highly accurate, fixed frequency reference. The source frequency is operated on to provide a wide band of frequencies, each possessing the stability or accuracy of the source. In the direct synthesis approach, the designer may employ dividers, multipliers and such devices which operate on the frequency standard to derive by algorithmetic processes, the required output range of frequencies.

In the indirect approach, a VCO or controlable oscillator or other tunable source is used as a generator of the frequency range desired and this is then locked to the source by means of a frequency or phase locked loop. Thus, one need not utilize complicated filtering schemes as necessary in the direct synthesis approach.

While the frequency synthesizer is characterized above as a separate test instrument, the techniques have found widespread use in the communications field as the local oscillator for a radio receiver or transmitter. A good description of some representative synthesizer techniques appear in a text entitled "Single Sideband Principles and Circuits," by Pappenfus, Bruen and Schoenike, published by McGraw-Hill (1964), chapter 8 entitled "Frequency Generation."

An important synthesizer approach employs the phase locked loop as a basic component for providing the required frequency band of the instrument. As such, the loop includes a VCO or voltage controlled oscillator whose output is phase locked to a desired multiple of the reference frequency.

The means of controlling the loop as to the division ratios employed and so on determine the flexibility of the final synthesizer.

One must provide an effective and efficient means of tuning the synthesizer or selecting any desired one of the plurality of frequencies capable of being generated.

The selection of such frequencies can be referred to as programming, whether such selection be made by manual switches or voltage controlled switches.

It is therefore an object of the present invention to provide a differential synthesizer capable of being programmed in an economical and efficient manner.

DESCRIPTION OF PREFERRED EMBODIMENT

A frequency synthesizer of the type employing a main phase locked loop and a vernier phase locked loop, each loop containing a voltage controlled oscillator (VCO) whose frequency is varied according to an error voltage provided by a phase detector in each of said loops to compare a divided version of said VCO with a predetermined reference frequency; the improvement therewith of apparatus for controlling one of said loops in a dual mode, comprising a plurality of switches each capable of selecting one digit of a desired output frequency, said switches including a first one and a last one, a programmable frequency divider included in said main loop and having an input responsive to the frequency output of said main VCO and an output coupled to an input of said phase detector, said divider including a series of control input terminals operative upon application of a signal thereto to cause said divider to divide said VCO frequency by a selected integer and means coupling said switches to said control inputs of said divider during a first mode to cause said divider to divide said VCO frequency by a first number during said first mode and operative during a second mode to cause said divider to divide said VCO frequency by a second integer during a second mode whereby an effective division ratio of said divider is the sum of said first and second integers.

DETAILED DESCRIPTION OF INVENTION

As indicated, a basic component of the system to be described is a phase locked loop. The phase locked loop is a well-known circuit configuration and an example of its operation may be had by referring to a text entitled "Electronic Integrated System Design" by Camenzind, published by the Van Nostrand Reinhold Company (1972), pages 252 to 255.

Many synthesizers employ such loops and there is a number of prior art references which explain and describe the operation of such loops. See, for example, U.S. Pat. No. 3,353,104 by T. L. Loposer, issued on Nov. 14, 1967 entitled FREQUENCY SYNTHESIS USING FRACTIONAL DIVISION BY DIGITAL TECHNIQUES WITHIN A PHASE LOCKED LOOP. See also U.S. Pat. No. 3,300,731 by A. J. Noyes, Jr. issued on Jan. 24, 1964.

In any event, a major problem with any synthesizer or test instrument used to develop a wide range of frequencies is the programming or tuning of the same.

This should be done as efficiently and economically as possible to permit wider utility and diversity of operation.

Figure 1:
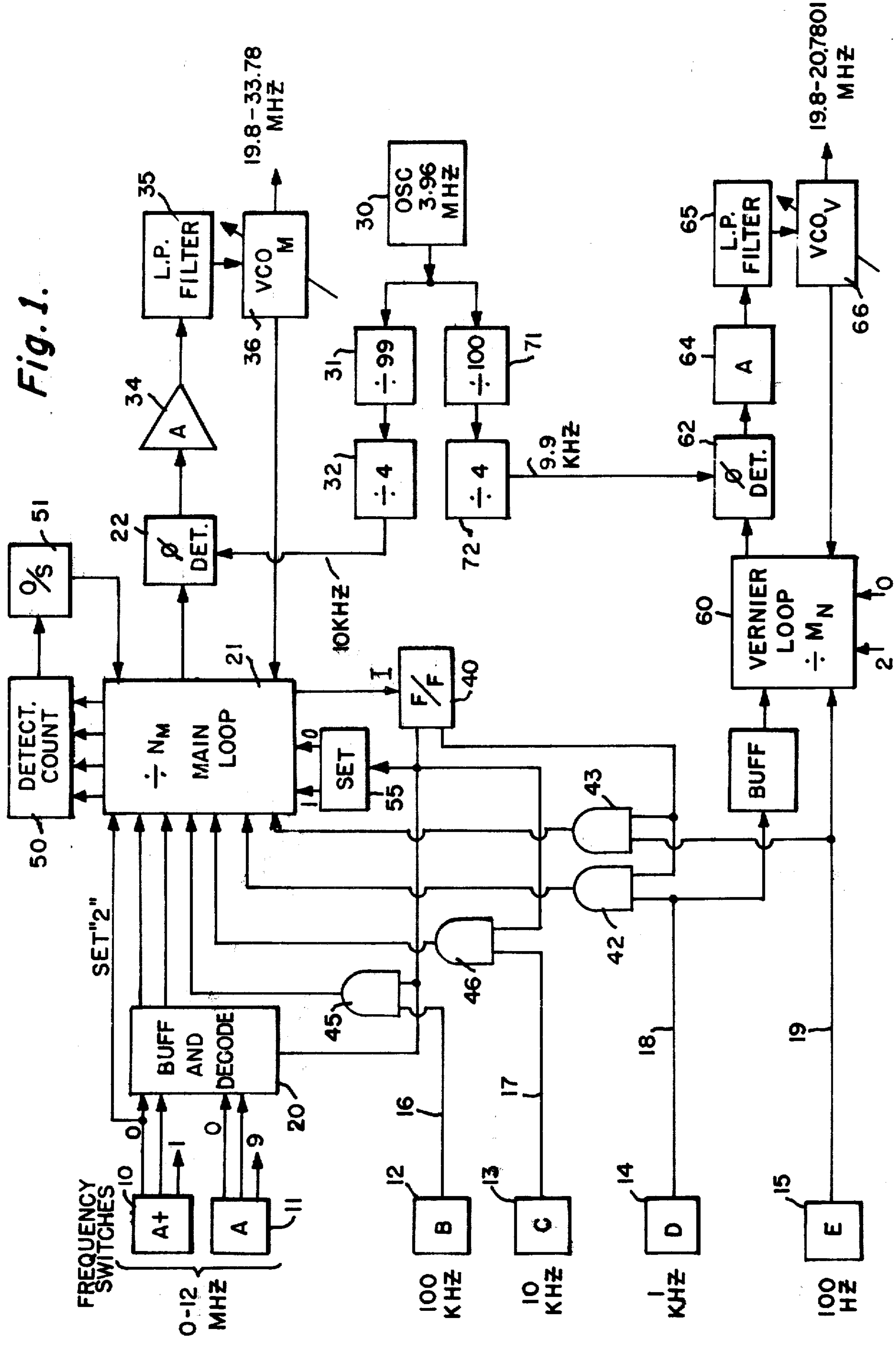
FIG. 1 is a block diagram of a synthesizer including a main and vernier phase locked loop operating according to the invention.

Referring to FIG. 1, there is shown a plurality of frequency selector switches referenced respectively as 10,11,12,13,14 and 15 and further designated as A,A+,B,C,D and E.

Each switch is a conventional multi-detent switch with a 10 position capability for switches B,C,D and E. Thus, each switch 12 to 15 may be placed in any one of ten (0 to 9) unique positions.

For the sake of clarity, the ten leads emanating from the output of the switches 12 to 15 are shown as single lines 16,17,18 and 19.

Switches A and A+ comprise a parallel shaft switch and the combination can be set for 12 unique positions to cover the frequency select range of 00 to 12 MHz. Thus the switches A and A+ as 10 and 11 retain the similar letter numeral A and A+.

Before proceeding further, the synthesizer to be described has an output frequency range from 0.1 Hz to 12.999 MHz. It is, of course, understood that any other range can be covered as well by modifying the components or adding structure. The above range to be described is not by way of limitation but is done for the sake of clarity and simplification of explanation.

The switches 10 and 11 are further coupled to a buffer or decoder 20 to assure that the 12 settings are properly decoded into a binary decimal coded (BCD) format to further control the requisite binary stages of the main loop frequency divider 21. The outputs of the other switches are also in BCD form or can be so converted to therefore permit these switches to operate typical digital logic circuitry such as counters including bistable multivibrator counting modules.

Thus, the switch settings accommodate the requisite frequency range as will be explained. The frequency select switches 10 to 15 select according to the table indicated below.

| SWITCH | FREQUENCY SELECT | REFERENCE NUMERAL |
|---|---|---|
| A and A+ | 00 to 12. MHz | 10 and 11 |
| B | 000 KHz to 900 KHz | 12 |
| C | 00 KHz to 90 KHz | 13 |
| D | 0 KHz to 9 KHz | 14 |
| E | .0000 KHz to .9000 KHz | 15 |

From the above tabulation, it is then seen that the bank of switches 10 to 15 can be set to a maximum number of 12.9999 MHz and a minimum number of 00.0000 MHz. Thus, the switches 10 to 15 can also be set to any number therebetween regarding the digit capabilities of the selector display. Thus, the minimum setting of the switches above all zeroes is 00.0001 MHz or 100 cycles (100 Hz).

The outputs of the A and A+ switches 10 and 11 via buffer or decoder 20 are applied to the two most significant stages of a programmable divider 21, which has a division ratio set by the switch settings and is referenced as the divide by Nm or the main loop divider. The outputs of the B and C switches are also applied to the least significant stages of the divider 21.

During a second mode, as will be explained, the divider 21 also receives the inputs from the D and E switches, which are applied to the two least significant binarys, while the upper binary divider's are set with a one (1) and a zero (0) during this second mode. The divider 21 is a programmable divider and is part of a phase locked loop. Programmable dividers are essentially dividers whose division ratio changes are according to a series of logic levels applied to controlled inputs. Such dividers are well known in the art and examples of many different types can be had by reference to a brochure entitled PROGRAMMABLE DIVIDER APPLICATIONS (AN-17) by Jeff Kalb of the National Semiconductor Corporation, published in October, 1968.

The main loop divider 21, as controlled by the frequency select switches, has an output coupled to a phase detector 22. The phase detector 22 is of a conventional design and is also a fundamental component of a phase locked loop. Another input to the phase detector 22 is derived from a time base assembly which includes a reference crystal oscillator 30, operating at a stable frequency of 3.96 MHz or 3,960,000 Hz. The output signal from oscillator 30 is applied to a divide by ninety-nine (÷99) module 31. The module 31 may comprise a plurality of binary multivibrators in cascade; to provide division by factors as indicated. The output of the divide by ninety-nine is applied to another binary divider 32 which performs a division by four and is implemented by a two stage binary counter.

Thus, the cascaded counters or dividers 31 and 32 perform a division of the oscillator 30 reference frequency by a factor of 396 to provide an output reference frequency for the phase detector 22 of 10,000 Hz or 10 KHz.

The phase detector 22 functions to compare this reference frequency with the frequency emanating from the main divider 21 to provide at an output of the phase detector 22, a control signal. The control signal is buffered or amplified by means of a loop amplifier 34 and filtered by means of the low pass filter 35. The output of the low pass filter 35 serves to control a variable reactance device associated with the VCO or voltage controlled oscillator 36. The VCO 36 is also an integral part of the phase locked loop. The oscillator 36 is of a conventional design and in this example, is tunable over a range of 19.8 to 33.78 MHz. The output of the oscillator 36 is applied to the input of the main loop divider 21, which as indicated, divides the output frequency by the programmable factor Nm to provide the phase detector 22 with a signal to be compared with the 10 KHz reference frequency signal.

The main divider 21 is selected so that it provides a division of 1980 when the frequency select switches are set at all zeroes. Thus, the division factor of 1980 is accomplished by the counter divider or the programmable divider 21, for a zero setting of the switches 10 to 15.

The operation of the loop is conventional as above described. The novel aspect of the configuration is that the main loop including divider 21 is caused to operate in two different modes. The main loop as described above, divides the VCO signal 36 by the fixed number (1980) plus the number programmed via the frequency select switches 10 to 15 as shown. The input to the divider 21 is multiplexed whereby 10 counts are dropped each half cycle to allow the main loop to produce a desired division of 1980.

The dual mode operation of the main loop is such that during a first mode or cycle, the divider divides by the setting afforded by switches A,A+,B and C minus 10. During the second mode or cycle, the main loop divides by the factor [10] DE minus 10.

The [10] is a forced setting of the two most significant division digits which indicates the division ratio of the main loop during the second cycle. For example, if the switches D and E (14 and 15) were programmed at four (4) and five (5) respectively, the divider 21 would divide the VCO 36 frequency by 1045 minus ten as 1035 during the second cycle. As will be explained, this technique of operating the main loop in a first and then a second mode enables one to eliminate adder circuitry and mixers, modulators and so on due to the multiplexing of the main loop in the manner described.

Such components are complicated, expensive and in general more difficult to implement.

Thus far, the dual aspect of the main loop has been alluded to but not discussed in detail. The dual mode operation is implemented by means of the flip-flop 40. The flip-flop or binary multivibrator receives a trigger pulse when the main divider is dividing by the fixed number division factor of 1980. Upon receipt of this pulse, the flip-flop 40 changes states and gates 42 and 43 are enabled; while the gates 45 and 46 and buffer-decoder 20 are disabled.

Thus, during the first mode, the divider 21 is programmed to divide by the setting of switches A,B, and C minus 10. The subtraction of the count ten is afforded by the detect count unit 50 and the one shot or monostable multivibrator 51.

Basically, the subtraction of a count such as ten from a counter involves the simple operation of either setting counter or divider ten counts less than the count stored at any time, or detecting when the counter is ten counts away from the zero or quiescent condition.

This is the function of the detect count module 50 and the one shot 51. The detect count 50 monitors the contents of the main loop divider 21 and triggers the one shot 51 when the count is 10 counts away from the predetermined desired count as will be explained. The one shot 51 then resets the divider 21 to the desired count at this time which basically causes the subtraction of ten as desired.

The gates included in buffer 20, gates 45,46,42 and 43 are "AND" gates which are selectively activated by flip-flop 40 and hence, serve as multiplexers to allow the A,B,C switch information to be applied to the divider 21 during the first mode and the D,E switch information to be applied to the divider during the second mode.

The operation of the main loop is as follows: assume that the operator wishes the generator to provide an output frequency of 9,555,500 Hz or 9.5555 MHz. The operator would then set switches 10 and 11 or A+ and A to 09, switch B to 5, Switch C to 5, Switch D to 5 and Switch E to 5.

The zero setting of switch A+ (0) always sets a one to obtain the correct division factor to be afforded to the main loop divider which is always 1 A,B,C, or in this example 1955 for a zero in the A+ position. The flip-flop 40 is not set during this first mode and the divider is therefore set via the A,B, and C switches at a division factor of 1955 during the first mode.

Since the divider is set at 1955 and is a down counter it decreases its count by one for each pulse received from the VCO 36. When the count in the down counter or divider 21 is ten, the detect count 50 via the one shot 51 resets the counter to the all zero or quiescent mode. This actually corresponds to a division by counter 21 of 1955−10 or 1945.

There is no counter output since the mode operation is not complete. Upon this condition, that is when the divider 4 has divided by 1945, the flip-flop 40 is triggered. This can be done via the one shot 51 or in any other conventional manner. During this second mode, the first two division digits of the counter are forced to be 10 via the set module 55 activated by flip-flop 40. The least two signficant digits are set via the D and E switch information applied to the counter 21 via gates 42 and 43. The counter 21 during this second mode is caused to divide by 10 or 1055. Again the detect count 50 and one shot 51 monitors the count and when ten remains, resets the counter to the quiescent state, thus obtaining an effective division ratio during the second mode of 1055, minus 10 or 1045. The phase locked loop operates at the end of this second mode since the VCO 36 is controlled to always attempt to provide an output frequency equal to the effective divisional ratio of the counter 21 times the reference frequency of 10 KHz.

The effective division ratio of the divider is the ratio of the first mode (1945) plus the ratio obtained during the second mode (1045). Thus, the effective ratio of the divider is 1045 plus 1945 or 2990.

This then, indicates that the VCO 36, when locked will provide the frequency of 2990 × 10 KHz or 29.90 MHz. The frequency of 29.90 MHz is therefore provided by the VCO 36 for a switch setting of 09.5555 MHz.

The vernier loop is also operating simultaneously with the main loop as above described. In this loop the division factor for the programmable divider 60 is always set at 20 for the first two digits and the division factor for the vernier loop is therefore 20 DE. The D and E switches 14 and 15 supply the vernier loop down counter divider 60 with the 55 as indicated for the above noted setting. Thus, the vernier loop is dividing by the factor of 2055. With all zero switch setting, this loop divides by 2000. There is no mode operation or count dropping associated with the vernier loop and hence the VCO 66 of this loop, as controlled by the phase detector 62, the low pass amplifier 65 and amplifier 64, is caused to operate at the reference frequency (9.9 KHz) multiplied by the division ratio of 2055. This frequency of the VCO 66 is then (2055 × 9.9 KHz) or 20.3445 MHz. One will now note that the frequency of the main VCO 36 is 29.9000 and the frequency of the vernier VCO 66 is 20.3445 MHz. The difference between the main VCO 36 frequency and the vernier VCO 66 frequency is:

$$\begin{array}{r} 29.9000 \\ -\,20.3445 \\ \hline 9.5555 \end{array}\ \text{MHz.}$$

This is the frequency set by the switches as above described.

The reference frequency (9.9 KHz) to the vernier loop is supplied via the dividers 71 and 72 coupled to the reference oscillator 30 to provide a division of the same of 100 × 4 or 400.

It can be ascertained from the above that with the ranges indicated for VCO 36 and VCO 66, the unit can provide frequencies from 0.1 to 12.9999 MHz in 0.1 Hz cycle steps by added circuitry.

The above described dual mode operation for the main loop has one further modification necessary to handle switch settings above 9.9999 MHz. If one desires to tune to 10.5555 MHz, then one sets the A and A+ switches to 10. When there is a one in the A+ switch setting, the main divider is then programmed with a two in the most significant digit. Thus for a switch setting of 10.5555 MHz, the A+ and A switches are set at 10, the B at 5, the C at 5, the D at 5 and the E at 5. The main divider, during the first mode, divides by 2 ABC or 2055, less 10 or 2045. During the second mode it divides by 10 DE again or 1055 less 10 or 1045. The effective division ratio is therefore 2045 and 1045 or 3090. The VCO 36 operates at 10 KHz × 3090 or 30.90 MHz. The vernier loop divides by 2055 and the VCO 66 provides the frequency of (2055 × 9.9 KHz) or 20.3445 MHz. The difference therebetween is 30.9000

-Continued $$\frac{-20.3445}{10.5555 \text{ MHz.}}$$

This again is the frequency selected by the switches.

Figure 2:
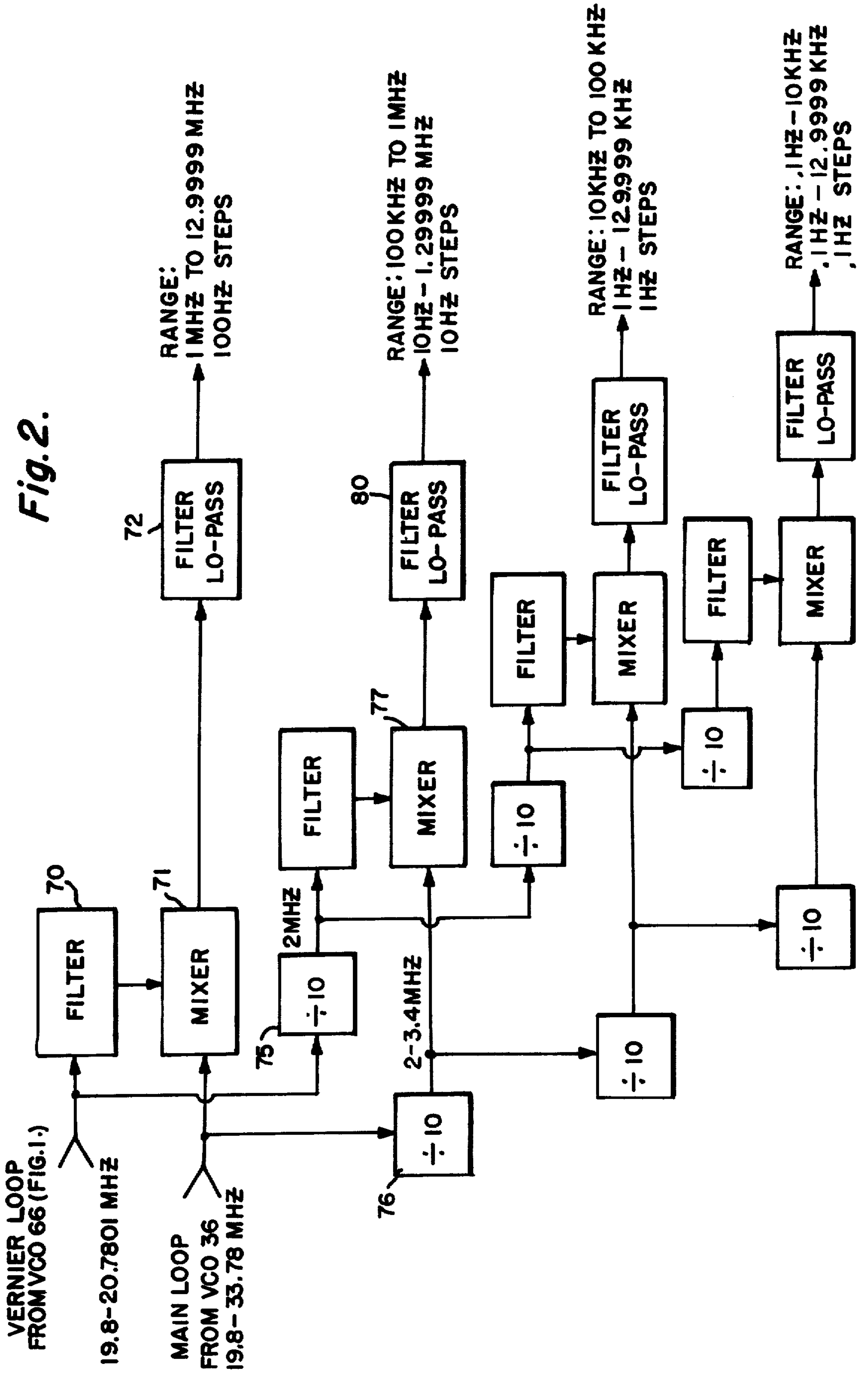
FIG. 2 is a block diagram of processing circuitry adapted to provide a desired range of synthesized frequencies.

Referring to FIG. 2, there is shown the additional components necessary to process the main loop output and the vernier output to provide the synthesizer range of frequencies.

The output from the vernier loop VCO 66 is applied to one input of a filter 70 which is a bandpass and serves to eliminate any spurious out-of-hand component frequency as well as upper harmonic components.

The full range of the VCO 66 output frequency is applied to one input of a mixer 71. The other input to mixer 71 which may also be filtered, is obtained from the main loop VCO 36. The mixer operates on the difference frequency to provide the lower mixing product via the low pass filter 72 to provide the range of 1 MHz to 12.9999 MHz, in 100 Hz steps. As above described, for the switch settings of 9.5555 MHz, the main VCO 36 is at 29.9000 MHz and the vernier VCO 66 is at 20.3445 MHz. The mixer 71 will have a lower sideband of 29.9000 MHz less 20.3445 MHz or 9.5555 MHz. Any frequency can be so provided as above indicated.

Assuming these settings for VCO 36 and VCO 66, the output of VCO 66 is then divided by ten in a binary divider 75 to provide at an output, the frequency of 2.03445 MHz. The output of VCO 36 is also divided by ten via divider 76 to provide an output of 2.9900 MHz. These frequencies are applied to a mixer 77 to provide the difference signal of 0.9555 MHz or 955.5 KHz.

The range of 100 KHz to 1 MHz is filtered by the low pass 80.

Thus, by performing divisions of ten and mixing one can provide all the ranges indicated in FIG. 2 by the same process as above described.

In summation, there is described a direct programmed differential synthesizer which operates with two loops, one of which is caused to operate in a dual mode indicative of a complete cycle to accumulate an effective division ratio without the need of additional adders or mixing circuits in the phase locked loops.

The operation of the loops is inherently stable and provides a range of synthesized frequencies all locked to or synchronized with the 3.96 MHz (oscillator 30) reference having the same phase and frequency stability. The multiplexing of the main loop with the decrease of the divider ratio by 10 affords the simple and efficient operation above described.

We claim:

1. In a frequency synthesizer of the type employing a main phase locked loop and a vernier phase locked loop, each loop containing a voltage controlled oscillator (VCO) whose frequency is varied according to an error voltage provided by a phase detector in each of said loops to compare said VCO with a predetermined reference frequency, the improvement therewith of apparatus for controlling one of said loops in a dual mode, comprising:

a. a plurality of switches, each capable of selecting one digit of a desired output frequency, said switches including a first one and a last one, b. a programmable frequency divider included in said main loop and having an input responsive to the frequency output of said main VCO and an output coupled to an input of said phase detector, said divider including a series of control input terminals operative upon application of a signal thereto to cause said divider to divide said VCO frequency by a selected integer, and c. means coupling said switches to said control inputs of said divider during a first mode to cause said divider to divide said VCO frequency by a first integer during said first mode and operative during a second mode to cause said divider to divide said VCO frequency by a second integer during a second mode whereby an effective division ratio of said divider is the sum of said first and second integers.

2. The apparatus according to claim 1 further including means for decrementing said programmable divider count by a factor of 2N during said first and second modes, where N is a positive integer, greater then one.

3. The apparatus according to claim 2 where N equals ten.

4. Apparatus for generating any given frequency within a predetermined range of of frequencies, each of said generated frequencies being synchronized with a reference frequency fR, comprising:

a. a phase locked loop including a (VCO) voltage controlled oscillator whose frequency can be varied according to an error signal developed in a phase detector having a first input responsive to said reference frequency fR, and a second input adapted to receive a comparison frequency, b. a plurality of switches capable of selecting said any frequency by specifying a fixed number of digits, c. a programmable counter having an input coupled to said VCO for dividing the frequency thereof by a division factor capable of being programmed into said counter, said output of said counter coupled to said second input of said phase detector, said counter having a series of control inputs adapted to receive control signals capable of selecting said division factor, d. means coupling said switches to said control inputs of said counter to cause said counter to divide by a first integer in a first mode and a second integer in a second mode to cause said division factor to be equal to the sum of said first and second integers, and e. detecting means operative in said first and second modes to monitor the contents of said counter and to cause said counter to decrement each of said first and second integers by a fixed amount to adjust said division factor to differ from said sum of said first and second integers by twice said fixed amount.

5. The apparatus according to claim 4 further including:

a. a vernier phase locked loop including a second programmable divider operative to divide a second voltage controlled oscillator frequency included in said second loop by a factor of WXYZ, said second phase locked loop including a reference frequency source and a phase detector to compare said second oscillator frequency with said reference frequency, where $W$ = fixed positive integer $X$ = fixed positive integer, including zero $Y$ = setting of one of said switches $Z$ = setting on another one of said switches, said factor of WXYZ causing said second VCO to produce a frequency output which when subtracted from said first VCO output equals the frequency selected by said plurality of switches.

6. The apparatus according to claim 4 wherein said first integer during a first mode is NABC wherein:

*N* = a positive integer including zero

*A* = a setting of a first one of said switches

*B* = a setting of another one of said switches

*C* = a setting of still another one of said switches.

7. The apparatus according to claim 4 wherein said second integer during said second mode is JKDE wherein:

*J* = is a positive integer greater than one

*K* = a positive integer including zero

*D* = setting of one of said switches

*E* = setting of another one of said switches.

8. The apparatus according to claim 5 wherein said reference frequency for said vernier phase locked loop is different from fR.

9. The apparatus according to claim 5 wherein *W* equals 2 and *X* equals 0.

10. The apparatus according to claim 6 wherein *N* = 1 for all frequencies selected below 9.99 MHz and *N* = 2 for all frequencies above 10.00 MHz during said first mode and *N* = 1 for all frequencies selected during said second mode.

* * * * *